(12) United States Patent
Jevtic

(10) Patent No.: US 7,091,721 B2
(45) Date of Patent: Aug. 15, 2006

(54) PHASED ARRAY LOCAL COIL FOR MRI IMAGING HAVING NON-OVERLAPPING REGIONS OF SENSITIVITY

(75) Inventor: Jovan Jevtic, West Allis, WI (US)

(73) Assignee: IGC—Medical Advances, Inc., Milwaukee, WI (US)

(*) Notice: Subject to any disclaimer, the term of this patent is extended or adjusted under 35 U.S.C. 154(b) by 345 days.

(21) Appl. No.: 10/122,476

(22) Filed: Apr. 12, 2002

(65) Prior Publication Data

US 2002/0169374 A1 Nov. 14, 2002

Related U.S. Application Data

(60) Provisional application No. 60/284,633, filed on Apr. 18, 2001.

(51) Int. Cl.
*G01V 3/00* (2006.01)

(52) U.S. Cl. ........................... 324/318; 324/322

(58) Field of Classification Search ............... 324/307, 324/309, 311, 313, 314, 318, 322; 600/410, 600/422; 333/219, 221, 222–225, 227, 230, 333/231, 235
See application file for complete search history.

(56) References Cited

U.S. PATENT DOCUMENTS

| | | | | |
|---|---|---|---|---|
| 4,695,801 A | | 9/1987 | Arakawa et al. | |
| 4,712,068 A | * | 12/1987 | Savelainen | 324/318 |
| 4,757,290 A | * | 7/1988 | Keren | 333/219 |
| 5,006,805 A | * | 4/1991 | Ingwersen | 324/322 |
| 5,144,240 A | * | 9/1992 | Mehdizadeh et al. | 324/318 |
| 5,179,332 A | * | 1/1993 | Kang | 324/313 |
| 5,317,266 A | * | 5/1994 | Meissner | 324/318 |
| 5,329,233 A | * | 7/1994 | Hayes | 324/318 |
| 5,489,847 A | * | 2/1996 | Nabeshima et al. | 324/318 |
| 5,548,218 A | * | 8/1996 | Lu | 324/318 |
| 5,708,361 A | * | 1/1998 | Wang et al. | 324/318 |
| 5,804,969 A | * | 9/1998 | Lian et al. | 324/318 |
| 5,808,467 A | * | 9/1998 | Ochi et al. | 324/309 |
| 5,929,639 A | * | 7/1999 | Doty | 324/318 |
| 5,998,999 A | * | 12/1999 | Richard et al. | 324/318 |
| 6,023,166 A | * | 2/2000 | Eydelman | 324/318 |
| 6,100,694 A | * | 8/2000 | Wong | 324/318 |
| 6,289,232 B1 | * | 9/2001 | Jakob et al. | 600/410 |
| 6,369,570 B1 | * | 4/2002 | Wong et al. | 324/318 |
| 6,377,047 B1 | * | 4/2002 | Wong et al. | 324/318 |
| 6,414,485 B1 | * | 7/2002 | Kato et al. | 324/307 |
| 6,493,572 B1 | * | 12/2002 | Su et al. | 600/422 |
| 6,501,274 B1 | * | 12/2002 | Ledden | 324/318 |
| 6,608,480 B1 | * | 8/2003 | Weyers | 324/318 |
| 6,661,229 B1 | * | 12/2003 | Weyers et al. | 324/318 |
| 6,747,452 B1 | * | 6/2004 | Jectic et al. | 324/311 |

OTHER PUBLICATIONS

Duensing GR et al., "Transmission Field Profiles for Transcieve Phased Array", Proc Intl Soc Mag Reson Med 8 (2000) p. 143.*
Jevtic J, "Ladder Networks for Capacitive Decoupling in Phased-Array Coils", Proc Intl Soc Mag Reson Med 9 (2001) p. 17.*

(Continued)

*Primary Examiner*—Diego Gutierrez
*Assistant Examiner*—Jeremiah Shipman
(74) *Attorney, Agent, or Firm*—Boyle Fredrickson Newholm Stein & Gratz S.C.

(57) ABSTRACT

A capacitor decoupling network allows the production of a multi-loop local coil for magnetic resonance imaging without overlap of the loops and/or with decoupling between both adjacent and non-adjacent coils. The former design may find application for new MRI techniques such as SMASH and SENSE.

21 Claims, 9 Drawing Sheets

OTHER PUBLICATIONS

G. R. Duensing et al., Transmission Field Profiles for Transceive Phased Array Coils p. 143, Proc. Intl. Soc. Mag. Reson. Med. 8 (2000).

Jianmin Wang, et al., A Novel Method to Reduce the Signal Coupling of Surface Coils for MRI, Proc. ISMRM 4:1434.

* cited by examiner

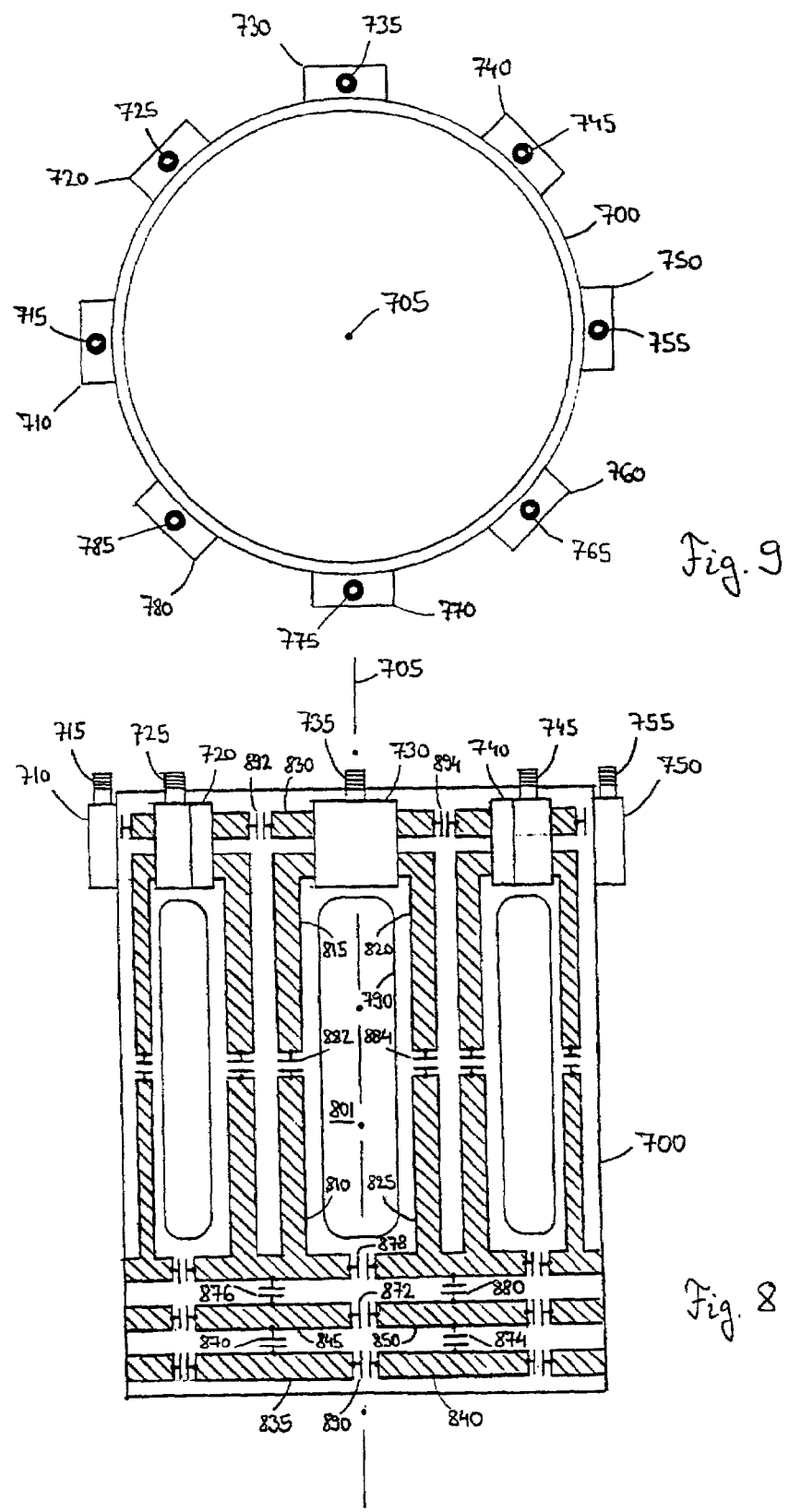

PHASED ARRAY LOCAL COIL FOR MRI IMAGING HAVING NON-OVERLAPPING REGIONS OF SENSITIVITY

CROSS-REFERENCE TO RELATED APPLICATIONS

This application is based on U.S. provisional application 60/284,633 filed Apr. 18, 2001 and claims the benefit thereof.

STATEMENT REGARDING FEDERALLY SPONSORED RESEARCH OR DEVELOPMENT

BACKGROUND OF THE INVENTION

The field of the invention is magnetic resonance imaging (MRI) and, in particular, local coils for use in MRI.

A. MRI Imaging

In MRI, a uniform magnetic field Bo is applied to an imaged object along the z-axis of a Cartesian coordinate system fixed with respect to the imaged object. The effect of the magnetic field Bo is to align the object's nuclear spins along the z-axis.

In response to a radio frequency (RF) excitation signal of the proper frequency oriented within the x-y plane, the nuclei precess about the z-axis at their Larmor frequencies according to the following equation:

$$\omega = \gamma B_0 \quad (1)$$

where $\omega$ is the Larmor frequency, and $\gamma$ is the gyromagnetic ratio which is a constant and a property of the particular nuclei. The value of the gyromagnetic ratio $\gamma$ for protons is 42.6 MHz/Tesla.

In a typical imaging sequence for an axial slice, an RF excitation signal having a frequency centered at the Larmor frequency of the protons is applied to the imaged object at the same time as a magnetic field gradient Gz is applied. The gradient field Gz causes only the nuclei in a slice with a limited width through the object along an x-y plane, to be excited into resonance.

After the excitation of the nuclei in this slice, magnetic field gradients are applied along the x and y axes. The gradient along the x-axis, Gx, causes the nuclei to precess at different frequencies depending on their position along the x-axis, that is, Gx spatially encodes the precessing nuclei by frequency. The y axis gradient, Gy, is incremented through a series of values and encodes the y position into the rate of change of phase of the precessing nuclei as a function of gradient amplitude, a process typically referred to as phase encoding.

A weak nuclear magnetic resonance generated by the precessing nuclei may be sensed by the RF coil and recorded as an NMR signal. From this NMR signal for a series of such signal acquisitions with different phase encodings, a slice image may be derived according to well-known reconstruction techniques. An overview of NMR image reconstruction is contained in the book "Magnetic Resonance Imaging, Principles and Applications" by D. N. Kean and M. A. Smith.

B. Phased Array Coils

The RF excitation and the magnetic resonance signal may be transmitted and received respectively by means of one or more RF coils. Improvements in the signal to noise ratio of the received magnetic resonance signal can be obtained by placing "local coils" on the patient. The local coil having a smaller reception pattern can focus in on the region of interest to obtain a stronger signal and to receive less noise. Multiple local coils can be arranged in quadrature and their signals combined to obtain greater signal to noise improvements.

Phased array RF coils are multiple loop local coils whose outputs are processed separately. In any multiple loop design, the proximity of the loops and the common loading due to the object being imaged can cause a significant coupling between the loops. Some of the undesirable effects of mutual coupling have long been recognized and include difficult tuning, reduced signal to noise ratio (SNR), and image artifacts. Such coupling can be reduced using one of the following three methods: pre-amplifier decoupling, coil overlap, and capacitive decoupling.

Pre-amplifier decoupling utilizes a high input impedance pre-amplifier, such as those having a field-effect transistor stage, to minimize the currents induced in the loops. Its performance is limited by the finite noise impedance of a field-effect transistor. If the pre-amplifiers are not located in the immediate vicinity of the loops, additional phase shifting circuits and half-wave length long cables may be necessary. In addition, if the coupling between the loops is too strong, the pre-amplifier decoupling may not be sufficient to achieve satisfactory performance.

It is for the latter reason that the pre-amplifier decoupling is usually augmented with the coil overlap. The region of overlap, being an area opening between coil conductors after they cross, serves to intercept some of the direct flux from the neighbor loop so as to cancel the returning flux of the neighbor's fringe field intercepted by the non-overlapping region. Unfortunately, the correct amount of coil overlap, to create the desired region of overlap, is practically impossible to determine beforehand and often must be determined experimentally. The correct amount of coil overlap is also sensitive to positional stability of the coils and is difficult to replicate in production.

Capacitive decoupling method utilizes a capacitor placed either in series or in shunt with a pair of adjacent loops.

B. SMASH and SENSE

The number of phase encoding acquisitions required in MRI limits the speed at which an image can be acquired. Normally the number of phase encoding acquisitions cannot be reduced without loss of spatial resolution or the creation of image artifacts. These artifacts are caused by an inability to distinguish among signal phase shifts associated with different volumes of the patient, when the phase dimension is undersampled.

Two new imaging techniques, termed SMASH and SENSE, allow undersampling of the phase dimension without loss of spatial resolution or artifacts. Generally, the techniques use the individual signals of a phased array coil to distinguish among phase shifts from different regions of the body.

Unfortunately, phased array coils are not perfectly suited for these applications as the overlap of the loops, intended to decrease the coupling between loops, also causes overlap of their spatial sensitivities, decreasing their ability to isolate signals to different regions of the patient.

BRIEF SUMMARY OF THE INVENTION

The present invention provides a phased array coil with adjacent but non-overlapping loops. A capacitive network is employed to isolate each loop both from its neighbor but also from non-adjacent coils of the array. In this respect, the network may offer an improvement for conventional overlapping loop phased array coils as well.

One feature of the invention is that it may provide a means of capacitive decoupling between any two loops forming a phased array, where the said loops are not necessarily adjacent to each other.

It is a further feature of this invention that it may provide a means of capacitive decoupling which may be used in conjunction with other decoupling means, such as preamplifier decoupling and coil overlap, in order to achieve a decoupling performance superior to any of the means applied in isolation.

The invention provides a phased-array coil that is especially suitable for new parallel imaging techniques, such as SENSE and SMASH.

Yet another object of this invention is to provide a phased-array coil which may be operated both as a single-channel linearly or circularly polarized coil and a multiple-channel phased array coil. The invention may be operated both as a receiving and a transmitting coil.

The foregoing objects and advantages may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

BRIEF DESCRIPTION OF THE DRAWINGS

FIG. 8 is a side elevation view of an improved eight-channel phased-array coil in its preferred form.

FIG. 9 is an end view in elevation of the same.

DETAILED DESCRIPTION OF THE INVENTION

Figure 1:
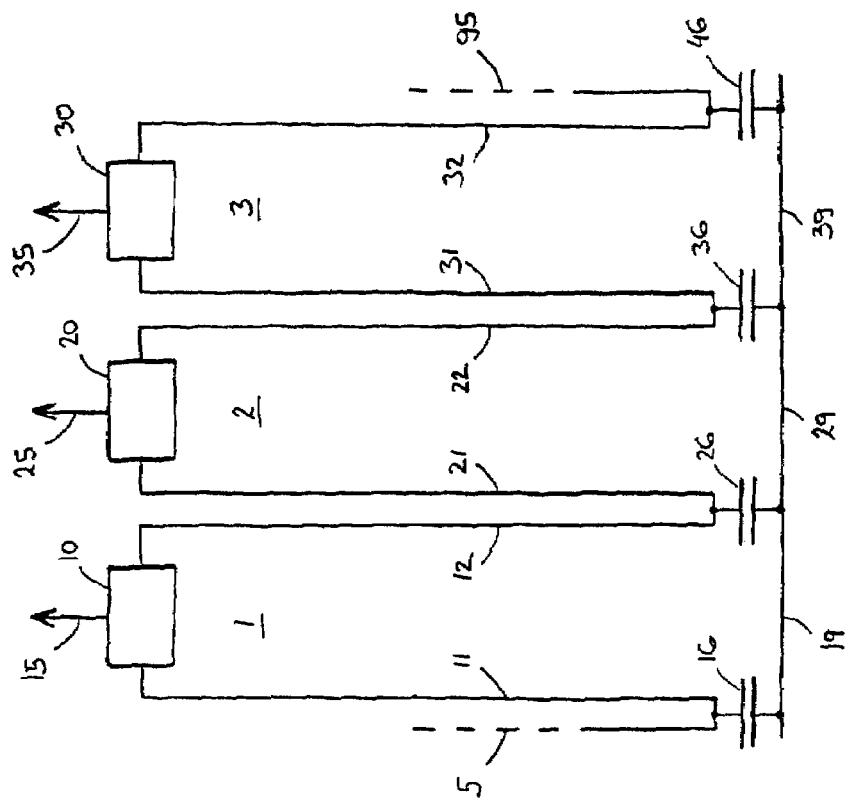
FIG. 1 is a diagrammatic illustration of a simplified capacitive decoupling of adjacent non-overlapping loops, serving to provide a basis for understanding of the present invention.

Referring to FIG. 1, conductors 11, 12, 21, 22, 31, and 32 are generally parallel conductors forming left and right sides of generally rectangular loops 1, 2, and 3. The loops 1, 2 and 3 have loop axes generally perpendicular to the plane of the loop (and thus extending out of the paper as depicted) and are displaced from each other along a displacement axis extending from left to right. The loops are "pairwise" adjacent, meaning that pairs of the loops 1, 2, and 3 are next to each other (i.e., loop pair 1 and 2, and loop pair 2 and 3), even though not every loop is adjacent to every other loop (i.e., loops 1 and 3). The lower sides of the loops 1, 2, and 3, are formed by conductors 19, 29 and 39, respectively and may be copper strips, which are connected in series with the decoupling capacitors 16, 26, 36, and 46 and the loop interfaces 10, 20, and 30, so as to form the loops 1, 2, and 3. Dashed lines 5 and 95 indicate that the array of identical loops may continue ad infinitum to the left and right of the loops 1, 2, and 3 which are the only ones shown in the drawing. The loops 1, 2, and 3 need not be of the same size or shape.

Following the clockwise direction, loop 1 is formed by the electrical conductor 11, loop interface 10, electrical conductor 12, decoupling capacitor 26, electrical conductor 19, and the decoupling capacitor 16. Loop 2 is formed by the electrical conductor 21 which runs parallel and adjacent to electrical conductor 12, loop interface 20, electrical conductor 22, decoupling capacitor 36, electrical conductor 29, and the decoupling capacitor 26. Loop 3 is formed by the electrical conductor 31 which runs parallel and adjacent to electrical conductor 22, loop interface 30, electrical conductor 32, decoupling capacitor 46, electrical conductor 39, and the decoupling capacitor 36.

Figure 1A:
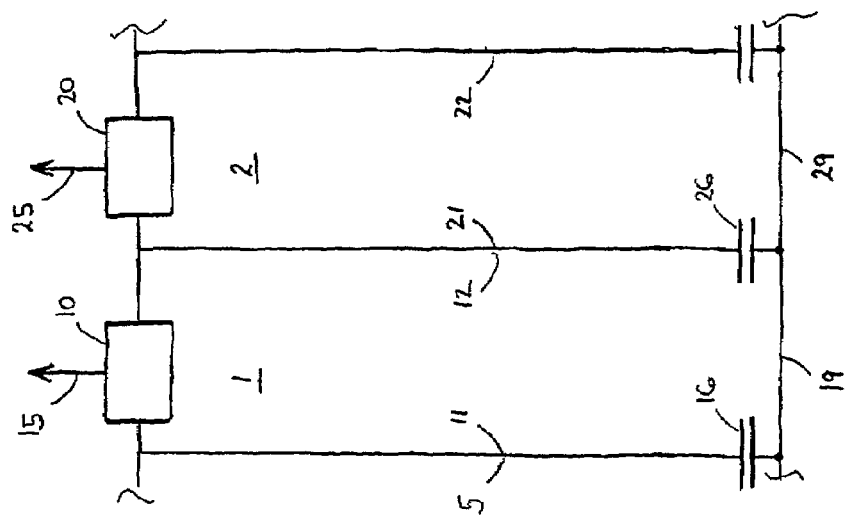
FIG. 1a is a detailed view of an alternative non-overlapping construction of the loops of FIG. 1.

The loops 1, 2, and 3 are non-overlapping, meaning that the conductors 12 and 21 and the conductors 22 and 31 do not cross to present an open area between them when viewed perpendicularly to the plane of the loops. As used herein, non-overlapping shall also include the case where the crossing conductors lie on top of one another (superposition) or are merged into one conductor, as shown in FIG. 1a, so long as no significant open area, through which countervailing magnetic flux could pass, is exposed.

Transmission lines 15, 25, and 35, such as, for example, coaxial cables, connect the loop interfaces 10, 20, and 30, respectively, to the MRI system which is not shown in the drawing. The loop interfaces 10, 20, and 30 contain all the electrical circuits required to properly match, tune, and balance the loops 1, 2, and 3, respectively, as well as to protect the loops during the transmission. Two detailed examples of the circuits contained within the loop interfaces 10, 20, and 30, will be described later in relation to FIGS. 7 and 11.

In order to explain the operation of the simple capacitive decoupling illustrated in FIG. 1, consider loops 1 and 2 which share a common decoupling capacitor 26. If a current is assumed to flow thru loop 1, it will induce a first electromotive force in loop 2, due to the mutual inductive coupling between loops 1 and 2. On the other hand, the current which flows thru loop 1 also flows thru the decoupling capacitor 26 and causes a voltage drop to appear across this capacitor. This voltage drop will appear as a second electromotive force impressed upon the loop 2. If the value of the decoupling capacitor 26 is adjusted properly, the said first and second electromotive forces impressed upon the loop 2, may be made very nearly equal in strength and opposing in direction, so as to make the net electromotive force impressed upon the loop 2 very nearly equal to zero. In this manner, the loops 1 and 2 will be decoupled, in the sense that the current flowing thru one loop would not impress any appreciable net electromotive force in the other loop.

One of the main shortcomings of the simple capacitive decoupling illustrated in FIG. 1 is that it can only be used to decouple the adjacent coils. For example, by proper adjustment of the values of the decoupling capacitors 26 and 36, loop 2 may be decoupled only from loops 1 and 3 for a total of up to three decoupled loops. Since most phased-array coils consist of more than three loops, the application of this simple design is limited.

Figure 2:
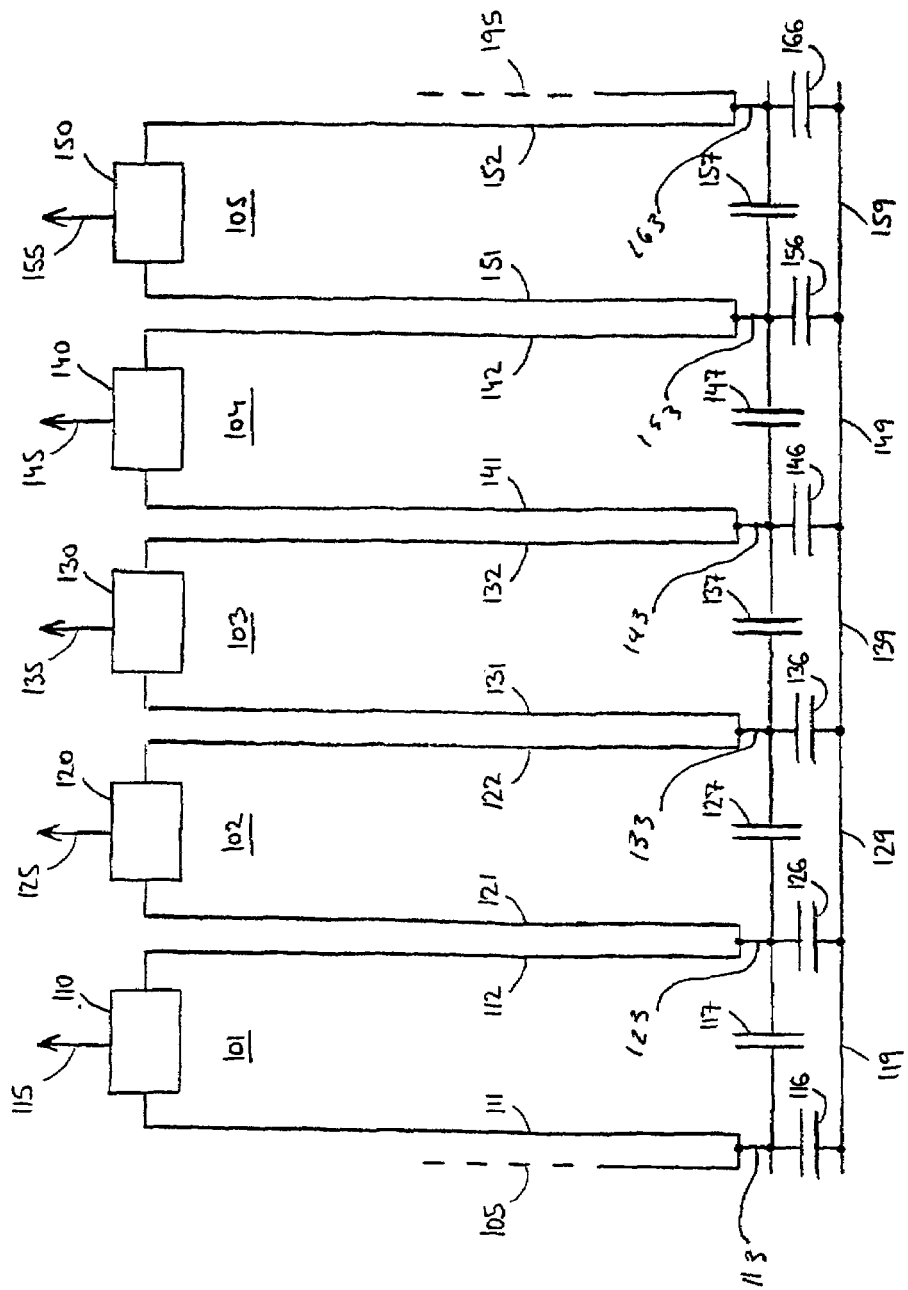
FIG. 2 is a diagrammatic illustration of an improved capacitive decoupling network containing two capacitors per loop.

FIG. 2 is a diagrammatic illustration an improved capacitive decoupling network according to the present invention capable of decoupling a given loop from two loops on each side of the given loop for a total of up to five decoupled loops. Following the clockwise direction, loop 101 is formed by the electrical conductor 111, loop interface 110, electrical conductor 112, and then the loop branches into two parallel paths, the first path formed by the decoupling capacitor 117, and the second path formed by the decoupling capacitor 126, electrical conductor 119, and the decoupling capacitor 116.

Similarly, loop 102 is formed by the electrical conductor 121, loop interface 120, electrical conductor 122, and then the loop branches into two parallel paths, the first path formed by the decoupling capacitor 127, and the second path formed by the decoupling capacitor 136, electrical conductor 129, and the decoupling capacitor 126. Loop 103 is formed by the electrical conductor 131, loop interface 130, electrical conductor 132, and then the loop branches into two parallel paths, the first path formed by the decoupling capacitor 137, and the second path formed by the decoupling capacitor 146, electrical conductor 139, and the decoupling capacitor 136. Loop 104 is formed by the electrical conductor 141, loop interface 140, electrical conductor 142, and then the loop branches into two parallel paths, the first path formed by the decoupling capacitor 147, and the second path formed by the decoupling capacitor 156, electrical conductor 149, and the decoupling capacitor 146. Loop 105 is formed by the electrical conductor 151, loop interface 150, electrical conductor 152, and then the loop branches into two parallel paths, the first path formed by the decoupling capacitor 157, and the second path formed by the decoupling capacitor 166, electrical conductor 159, and the decoupling capacitor 156.

Dashed lines 105 and 195 indicate that the array of identical loops may continue ad infinitum to the left and right of the loops 101, 102, 103, 104, and 105 which are the only ones shown in the drawing. The loops need not be the same size or shape, nor need they be rectangular as shown. Transmission lines 115, 125, 135, 145, and 155 connect the loop interfaces 110, 120, 130, 140, and 150, respectively, to the MRI system which is not shown in the drawing. The loop interfaces 110, 120, 130, 140, and 150 are identical to loop interfaces 10, 20, and 30 in FIG. 1.

The operation of the improved capacitive decoupling network illustrated in FIG. 2 may be understood by considering the coupling between the central loop 103 and the remaining loops shown in the drawing. The decoupling capacitors 136 and 146 serve very much the same purpose as the capacitors 26 and 36 of the simple design shown in FIG. 1. The main difference is that, due to the branching of the loop 103 into two parallel paths, not all of the current flowing thru the loop 103 will flow thru the decoupling capacitors 136 and 146. This changes things quantitatively compared to the simple design of FIG. 1, in the sense that the optimum value of the decoupling capacitors 136 and 146 in FIG. 2 may be different than the optimum value of the decoupling capacitors 26 and 36 in FIG. 1. However, an optimum value of the decoupling capacitors 136 and 146 may still be found such that the loop 103 is decoupled from both loops 102 and 104, which are adjacent to it. Furthermore, the present invention introduces an element beyond the simple design of FIG. 1, namely, the decoupling capacitors 117, 127, 137, 147, and 157 whose purpose is to enable the decoupling of non-adjacent loops.

Consider, for example, a current flowing thru loop 103 which induces a first electromotive force into loop 101, due to the mutual inductive coupling between the loops 101 and 103. A portion of the voltage drop developed across the capacitor 136, due to the current flowing thru loop 103, will be capacitively coupled to loop 101 via the decoupling capacitor 127, thus impressing a second electromotive force onto loop 101. If the value of the decoupling capacitor 127 is adjusted properly, the said first and second electromotive forces impressed upon the loop 101, may be made very nearly equal in strength and opposing in direction, so as to make the net electromotive force impressed upon the loop 101 very nearly equal to zero. In this manner, the loops 101 and 103 will be decoupled, in the sense that the current flowing thru one loop would not impress any appreciable net electromotive force in the other loop.

Similarly, if the value of the decoupling capacitor 147 is adjusted properly, the loops 103 and 105 may be decoupled. Consequently, the embodiment of the present invention, shown in FIG. 2, enables the decoupling of the loop 103, not only from the adjacent loops 102 and 104, but also from the two non-adjacent loops, 101 and 105, for a total of up to five decoupled loops.

Yet another way to explain the operation of the circuit shown in FIG. 2, which yields itself to further generalization, is to consider the capacitive network formed by the decoupling capacitors 116, 117, 126, 127, 136, 137, 146, 147, 156, 157, and 166 and the electrical conductors 119, 129, 139, 149, and 159 separately from the rest of the circuit. Namely, the said capacitive network may be classified as a ladder network with two capacitors per ladder stage, where 113, 123, 133, 143, 153, and 163 are the terminals of the ladder network. A potential applied to one of the terminals, say terminal 133, would result in a smaller potential at the adjacent terminal 123, due to the capacitive divider action of capacitors 126 and 127. A non-adjacent terminal 113 would have an even smaller potential due to the additional capacitive divider action of capacitors 116 and 117. Similarly, the inductive coupling between the non-adjacent loops 101 and 103 is smaller than the inductive coupling between the adjacent loops 102 and 103.

Consequently, the ladder network may be designed so that the rate of decay of the decoupling voltage from one stage to another very nearly equals the rate of decay of the mutual inductance from one loop to another. If the loops and the said ladder network are connected together as in FIG. 2, the decoupling voltage, provided by the ladder network, would vary in proportion to the mutual inductance, thus assuring the decoupling of the non-adjacent loops. A general quantitative relationship which should be satisfied between the parameters of a capacitive decoupling network and the mutual inductances between the loops will be derived in detail in relation to FIG. 4.

Figure 3:
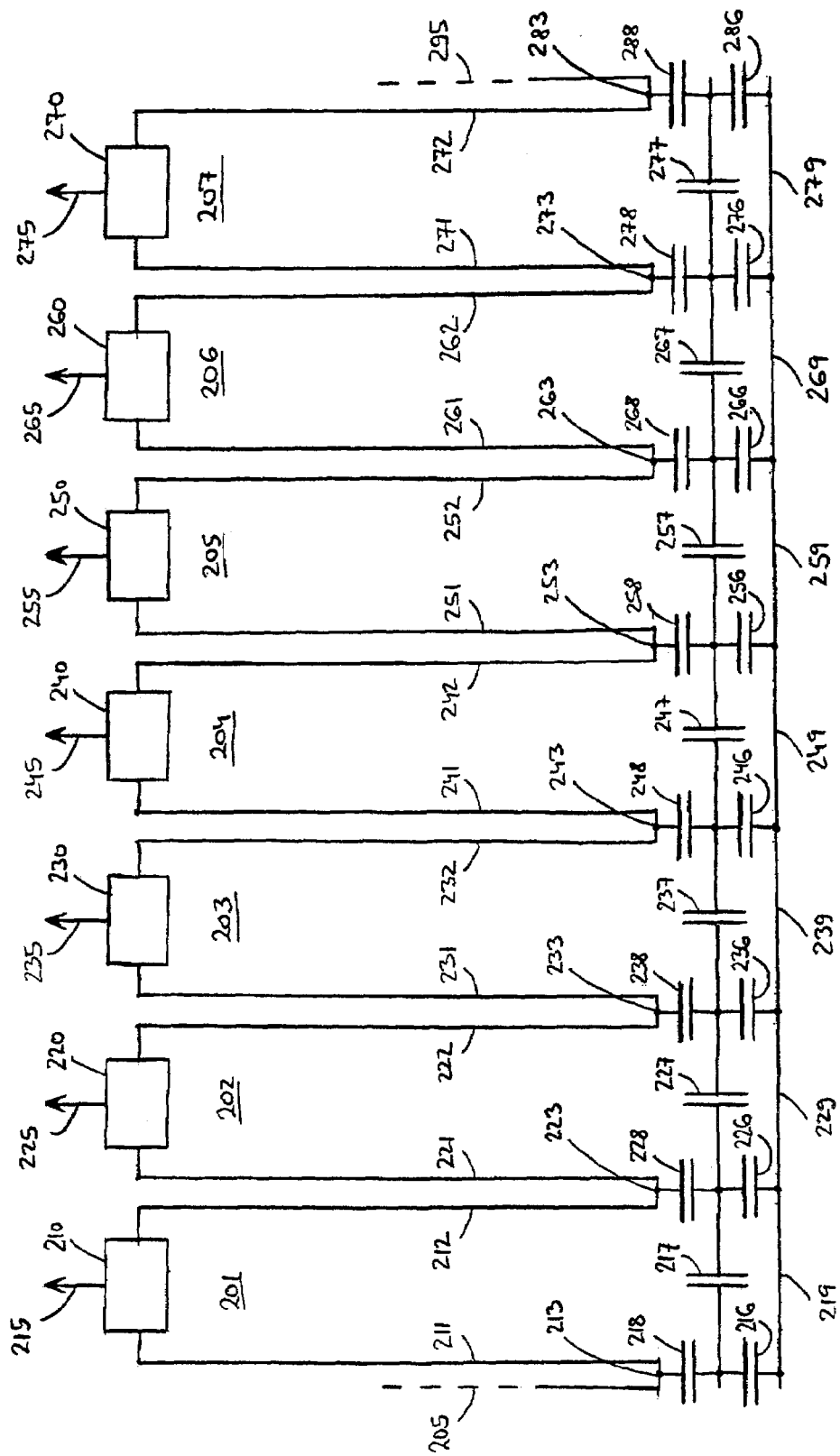
FIG. 3 is a diagrammatic illustration of an improved capacitive decoupling network containing three capacitors per loop.

FIG. 3 is a diagrammatic illustration of a further improvement in the design of the capacitive decoupling network capable of decoupling a given loop from three loops on each side of the given loop for a total of up to seven decoupled loops. Following the clockwise direction, loop 201 is formed by the decoupling capacitor 218, the electrical conductor 211, loop interface 210, electrical conductor 212, decoupling capacitor 228, and then the loop branches into two parallel paths, the first path formed by the decoupling capacitor 217, and the second path formed by the decoupling capacitor 226, electrical conductor 219, and the decoupling capacitor 216.

Similarly, loop 202 is formed by the decoupling capacitor 228, the electrical conductor 221, loop interface 220, electrical conductor 222, decoupling capacitor 238, and then the loop branches into two parallel paths, the first path formed by the decoupling capacitor 227, and the second path formed by the decoupling capacitor 236, electrical conductor 229, and the decoupling capacitor 226. Loop 203 is formed by the decoupling capacitor 238, the electrical conductor 231, loop interface 230, electrical conductor 232, decoupling capacitor 248, and then the loop branches into two parallel paths, the first path formed by the decoupling capacitor 237, and the second path formed by the decoupling capacitor 246, electrical conductor 239, and the decoupling capacitor 236. Loop 204 is formed by the decoupling capacitor 248, the electrical conductor 241, loop interface 240, electrical conductor 242, decoupling capacitor 258, and then the loop branches into two parallel paths, the first path formed by the decoupling capacitor 247, and the second path formed by the decoupling capacitor 256, electrical conductor 249, and the decoupling capacitor 246. Loop 205 is formed by the decoupling capacitor 258, the electrical conductor 251, loop interface 250, electrical conductor 252, decoupling capacitor 268, and then the loop branches into two parallel paths, the first path formed by the decoupling capacitor 257, and the second path formed by the decoupling capacitor 266, electrical conductor 259, and the decoupling capacitor 256. Loop 206 is formed by the decoupling capacitor 268, the electrical conductor 261, loop interface 260, electrical conductor 262, decoupling capacitor 278, and then the loop branches into two parallel paths, the first path formed by the decoupling capacitor 267, and the second path formed by the decoupling capacitor 276, electrical conductor 269, and the decoupling capacitor 266. Finally, loop 207 is formed by the decoupling capacitor 278, the electrical conductor 271, loop interface 270, electrical conductor 272, decoupling capacitor 288, and then the loop branches into two parallel paths, the first path formed by the decoupling capacitor 277, and the second path formed by the decoupling capacitor 286, electrical conductor 279, and the decoupling capacitor 276.

Dashed lines 205 and 295 indicate that the array of identical loops may continue ad infinitum to the left and right of the loops 201, 202, 203, 204, 205, 206, and 207 which are the only ones shown in the drawing. Transmission lines 215, 225, 235, 245, 255, 265, and 275 connect the loop interfaces 210, 220, 230, 240, 250, 260, and 270, respectively, to the MRI system which is not shown in the drawing. The loop interfaces 210, 220, 230, 240, 250, 260, and 270 are identical to loop interfaces 110, 120, 130, 140, and 150 in FIG. 2 and loop interfaces 10, 20, and 30 in FIG. 1.

The exact values of the capacitors of the network will change depending on the geometry of the loops and other factors that will be understood to those of ordinary skill in the art. In certain cases, the values of the capacitors may be so large as to present what is essentially a short circuit for relevant radio-frequencies. Alternatively, small capacitors may be required that appear essentially as an open circuit for the relevant radio frequencies. In these cases, the particular capacitors may be replaced by short circuits or open circuits respectively and such implementations should be consider part of the invention.

For example, in the embodiment of FIG. 3, capacitors 216, 226, 236, 246, 256, 266, 276, and 286 may be so small, for certain implementations, as to be replaced, effectively, with open circuits. The effect of this is to eliminate these capacitors and the transverse electrical conductors 219, 229, 239, 249, 259, 269, and 279 from the circuit. Generally, the broadest aspect of the invention should not be considered limited to a particular capacitive decoupling network and these networks are shown by way of example only.

In order to understand the operation of the circuit shown in FIG. 3, consider the capacitive network, formed by the capacitors 216, 217, 218, 226, 227, 228, 236, 237, 238, 246, 247, 248, 256, 257, 258, 266, 267, 268, 276, 277, 278, 286, and 288 separately from the rest of the circuit. The said capacitive network may be classified as a ladder network with three capacitors per ladder stage, where 213, 223, 233, 243, 253, 263, 273, and 283 are the terminals of the ladder network. Since there are at least three independent capacitor values which may be adjusted in the said ladder network, the rate of decay of the decoupling voltage along the ladder network, as explained in relation to FIG. 2, may be adjusted so as to match the rate of decay of the mutual inductance between the loops for at least three loops on each side of a given loop, for a total of up to seven decoupled loops.

The examples shown in FIGS. 1, 2, and 3 are but particular implementations of a general ladder network of decoupling capacitors which may in general contain M capacitors per ladder stage, where M is an arbitrary integer number. In FIG. 1, M is equal to one, for a total of up to three decoupled loops. In FIG. 2, M is equal to two, for a total of up to five decoupled loops. In FIG. 3, M is equal to three, for a total of up to seven decoupled loops. The circuits in FIGS. 1, 2, and 3 may readily be modified by those skilled in the art based on the present teachings in order to implement a ladder network of decoupling capacitors with more than three capacitors per ladder stage. Such a ladder network with M capacitors per ladder stage may be used to decouple a total of up to 2*M+1 loops.

Figure 4:
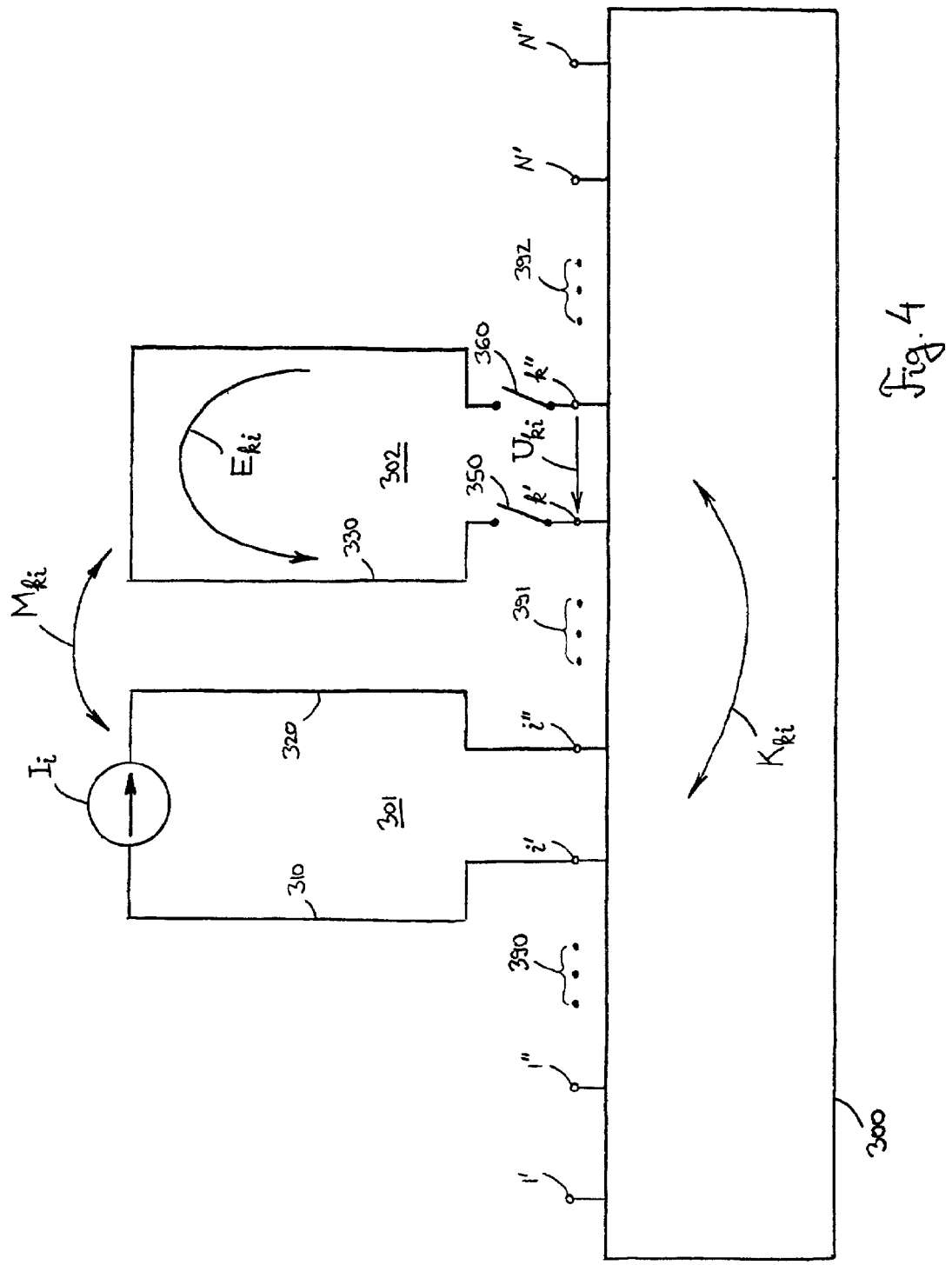
FIG. 4 is a diagrammatic illustration of an N loop phased-array coil with an improved N terminal pair decoupling network.

FIG. 4 will be used to derive the general conditions which must be met in order to achieve a proper loop decoupling action according to the present invention. The decoupling network 300 is a general linear, reciprocal, passive, and reactive electrical network with N terminal pairs, where N is an arbitrary integer number. The first pair of terminals is designated by l'l", the i-th pair of terminals is designated by i'i", the k-th pair of terminals is designated by k'k", and the N-th pair of terminals is designated by N'N". All the remaining terminal pairs are represented by dotted lines 390, 391, and 392. In normal operation, all N terminal pairs would be connected to N loops to form an N-loop phased-array coil. However, only loops 301 and 302, connected to terminal pairs i'i" and k'k", respectively, are shown in the drawing, with their respective loop interface circuitry omitted, so as to make the exposition clearer. For the same reason, switches 350 and 360 are placed between the loop 302 and the terminal pair k'k", although they would not be present in a practical phased-array coil. Loop 301 is formed by the electrical conductor 310, the current source $I_i$, and the electrical conductor 320. Loop 302 is formed by electrical conductor 330.

Let us first assume that switches 350 and 360 are open, as shown in FIG. 4. The current source $I_i$ sets up a current thru loop 301, and also acts as a current source at the terminals i'i" of the decoupling network 300. Thus, the effect of the current flowing thru loop 301 is twofold. First, due to the mutual inductive coupling between loops 301 and 302, characterized by the mutual inductance $M_{ki}$, the first electromotive force $E_{ki}$ will be induced in the loop 302. The value of the said electromotive force may be calculated based on the Faraday's law of induction:

$$E_{ki} = -j\omega M_{ki} I_i$$

where $j=\sqrt{-1}$ and $\omega$ is the angular frequency of the current source $I_i$. On the other hand, due to the capacitive coupling between the terminal pairs i'i" and k'k", mediated thru the decoupling network, and characterized by the mutual stiffness or trans-stiffness parameter $K_{ki}$, a second electromotive force $U_{ki}$ will develop across the terminal pair k'k". The value of the said electromotive force may be calculated based on the general definition of the trans-stiffness parameters:

$$U_{ki} = \frac{K_{ki}}{j\omega} I_i$$

where the dimension of stiffness is that of inverse of capacitance.

If we now assume that switches 350 and 360 are closed, the electromotive forces $E_{ki}$ and $U_{ki}$ would act in opposite directions and their net effect on loop 302 may be made equal to zero if the following obvious condition is met:

$$E_{ki} = U_{ki}$$

Consequently, the loops connected to terminal pairs i'i" and k'k" will be decoupled if the following condition is satisfied:

$$K_{ki} = \omega^2 M_{ki}$$

which may be generalized to any two terminal pairs of the decoupling network 300 by letting k and i vary between 1 and N, excluding the cases when i equals k. The last equation provides a quantitative rule for the design of the decoupling network, given the mutual inductance between any two pair of loops.

Figure 6:
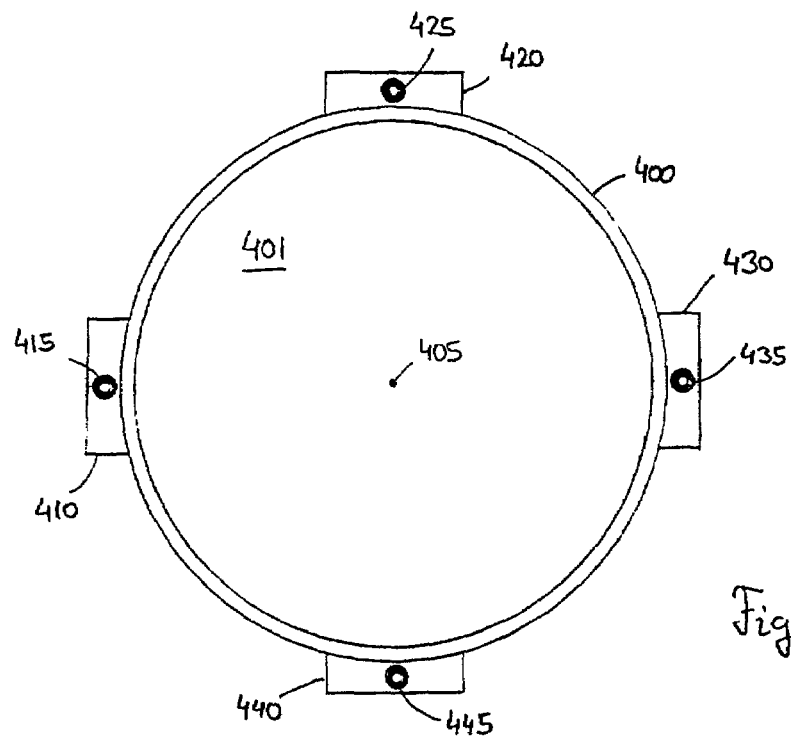
FIG. 6 is an end view in elevation of the same.
Figure 5:
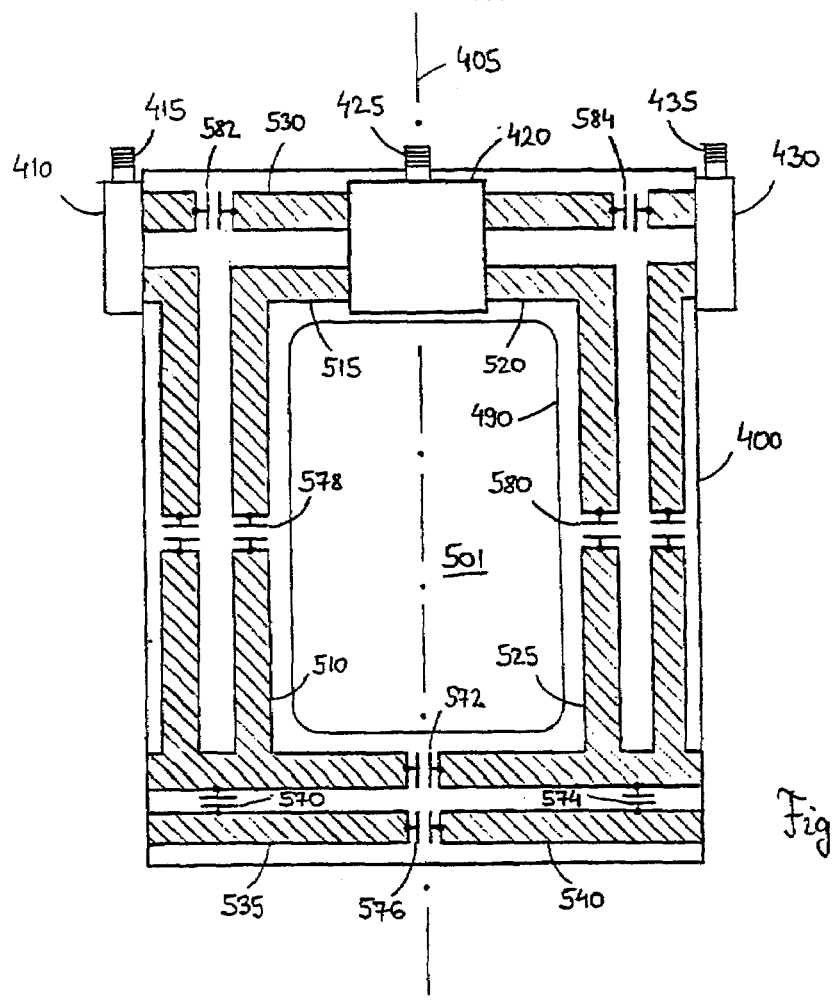
FIG. 5 is a side elevation view of an improved four-channel phased-array coil.

In reference to FIGS. 5 and 6, which show an embodiment of the present invention in the form of a four channel phased-array coil, 400 is a cylindrical coil former whose purpose is to provide a mechanical support for the electrical circuits. Additional mechanical parts for cover and support may be provided according to the well-established practice in the mechanical design of MRI coils and the said parts have been omitted in the drawings for clarity. The axis 405 of the cylindrical coil former 400 should be very nearly aligned with the direction of the static magnetic field provided by the MRI system, not shown in the drawings. The part of the patient's anatomy to be imaged, such as a patient's head or a limb, not shown in the drawing, should be inserted inside the cylindrical former 400. Four or more cutouts 490 may be provided in the cylindrical former 400 in order to improve the circulation of air, to reduce claustrophobic reaction in a patient, and to provide an easy access for stimulating and sensory apparatus as may be required in a functional MRI study.

In the side elevation view shown in FIG. 5, 501 is the only loop which is completely visible. The remaining three loops are either completely invisible or partially visible, but their configuration is in all respects identical to loop 501. Following a clockwise direction, loop 501 is formed by a copper strip 510, a tuning capacitor 578, a copper strip 515, a loop interface 420, a copper strip 520, a tuning capacitor 580, a copper strip 525, and then it branches into two parallel paths, the first path formed by the decoupling capacitor 572, and the second path formed by the decoupling capacitor 574, a copper strip 540, a DC blocking capacitor 576, a copper strip 535 and the decoupling capacitor 570.

Visible in the end view in FIG. 6 are all four-loop interfaces 410, 420, 430, and 440 with their respective cable connectors 415, 425, 435, and 445. Additional copper strip 530 is provided for better equalization of RF grounds between cable connectors 415, 425, 435, and 445. The decoupling capacitors visible in FIG. 5 are 570, 572, and 574 and they play a similar role to the decoupling capacitors 136, 137, and 146 in FIG. 2.

According to the present invention, up to five loops may be decoupled with a capacitive ladder network which has two capacitors per ladder stage, as in FIG. 2. However, a smaller number of loops may be implemented as well, such as only four loops in FIGS. 5 and 6. Tuning capacitors 578 and 580 also serve as DC blocking capacitors for any switching signals which may originate from the MRI system. Capacitors 576, 582, and 584 are large value DC blocking capacitors whose purpose is to reduce the eddy currents which may be generated in copper strips 530, 535, and 540 due to the action of MRI system gradients.

Figure 7:
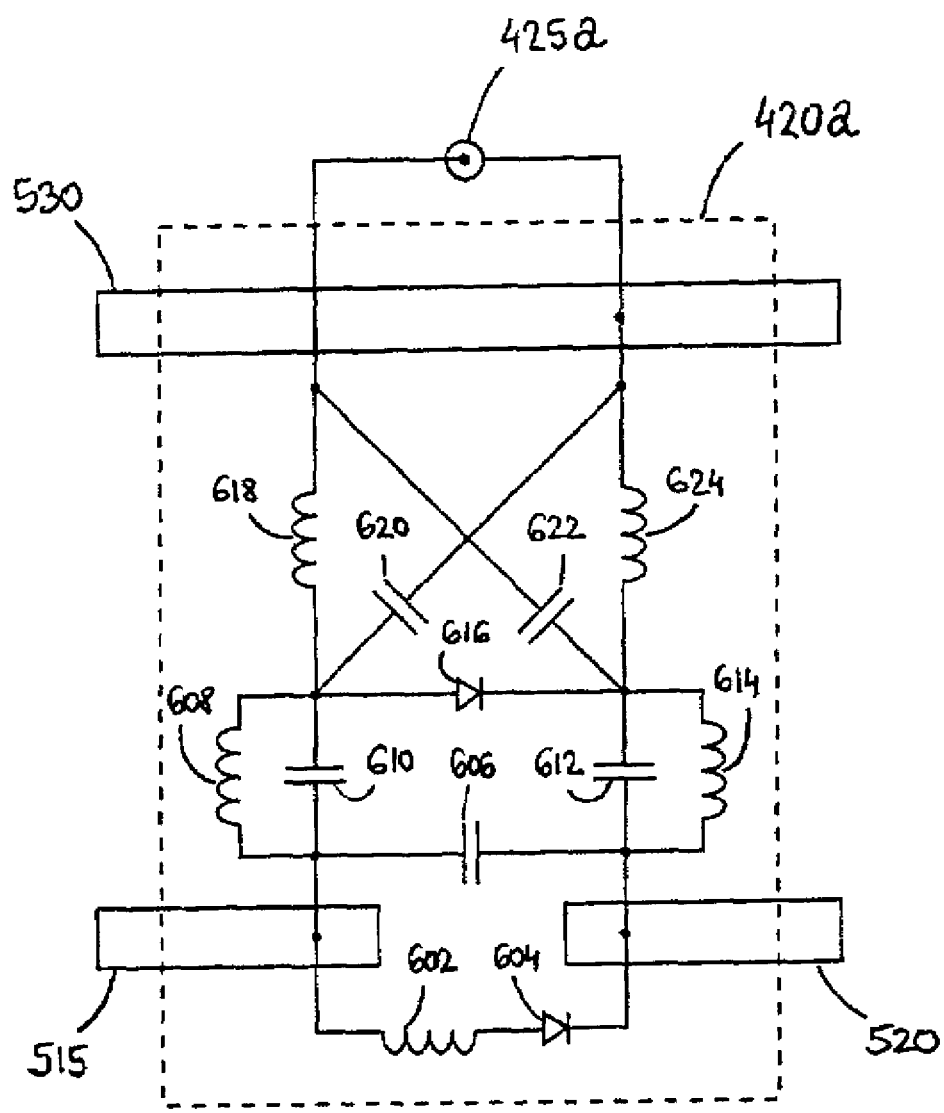
FIG. 7 is a circuit diagram of the receive-only loop interface.

FIG. 7 is a detailed electrical circuit diagram of one possible realization of the loop interface 420 in FIGS. 5 and 6. The particular loop interface 420a shown in FIG. 7 is suitable for receive-only mode of operation. The loop 501 in FIG. 5 is connected to the loop interface 420a via copper strips 515 and 520. Capacitors 606, 610, and 612 form a balanced tuning and matching network. Inductors 618 and 624 and capacitors 620 and 622 form a balun transformer whose one end is connected to the unbalanced cable connector 425a. The outer conductor of the cable connector 425a is connected to the copper strip 530, which serves as a common RF ground for all channels of the phased-array coil. The RF choke inductors 608 and 614 serve as a path for DC switching signals coming from the MRI system via the cable connector 425a. During reception, the center conductor of the cable connector 425a becomes negative with respect to the outer conductor which causes the switching PIN diodes 604 and 616 to turn off so that they do not affect the operation of the circuit in the receive mode. However, during transmission, the center conductor of the cable connector 425a becomes positive with respect to the outer conductor and the switching PIN diodes 604 and 616 became conductive for the RF currents. This has two effects. First, the RF signal is prevented from entering the balun due to the RF short circuit created by the PIN diode 616. Second, the transmitter-decoupling inductor 602 is connected across the copper strips 515 and 520 due to the activation of the PIN diode 604. The inductor 602, in conjunction with the capacitors 606, 610, and 612, as well as the RF choke inductors 608 and 614 forms a parallel resonant circuit whose impedance is very high when measured between the copper strips 515 and 520. The said high impedance serves to limit the RF currents induced in the loop 501 during transmission.

In reference to FIGS. 8 and 9, which show the preferred embodiment of the present invention in the form of an eight channel phased-array coil, 700 is a cylindrical coil former whose purpose is to provide a mechanical support for the electrical circuits. Additional mechanical parts for cover and support may be provided according to the well-established practice in the mechanical design of MRI coils and the said parts have been omitted in the drawings for purposes of clarity. The axis 705 of the cylindrical coil former 700 should be very nearly aligned with the direction of the static magnetic field provided by the MRI system, not shown in the drawings. The part of the patient's anatomy to be imaged, such as a patient's head or a limb, not shown in the drawing, should be inserted inside the cylindrical former 700. Eight or more cutouts 790 may be provided in the cylindrical former 700 in order to improve the circulation of air, to reduce claustrophobic reaction in a patient, and to provide an easy access for stimulating and sensory apparatus as may be required in a functional MRI study.

In the side elevation view shown in FIG. 8, 801 is the central loop out of three loops which are completely visible. The remaining five loops are either completely invisible or partially visible, but their configuration is in all respects identical to loop 801. Following a clockwise direction, loop 801 is formed by a copper strip 810, a tuning capacitor 882, a copper strip 815, a loop interface 730, a copper strip 820, a tuning capacitor 884, and copper strip 825. Visible in the end view in FIG. 9 are all eight-loop interfaces 710, 720, 730, 740, 750, 760, 770, and 780 with their respective cable connectors 810, 820, 830, 840, 850, 860, 870, and 880. Additional copper strip 830 is provided for better equalization of RF grounds between cable connectors 810, 820, 830, 840, 850, 860, 870, and 880. The capacitate decoupling network is formed out of decoupling capacitors 870, 872, 874, 876, 878, and 880, and the copper strips 835, 840, 845, and 850, and the DC blocking capacitor 890. According to the present invention, up to nine loops may be decoupled with a capacitive ladder network which has four capacitors per ladder stage. However, a smaller number of loops may be implemented as well, such as only eight loops in FIGS. 8 and 9. Tuning capacitors 882 and 884 also serve as DC blocking capacitors for any switching signals which may originate from the MRI system. Capacitors 890, 892, and 894 are large value DC blocking capacitors whose purpose is to reduce the eddy currents which may be generated in copper strips 835, 840, and 830 due to the action of MRI system gradients.

Figure 10:
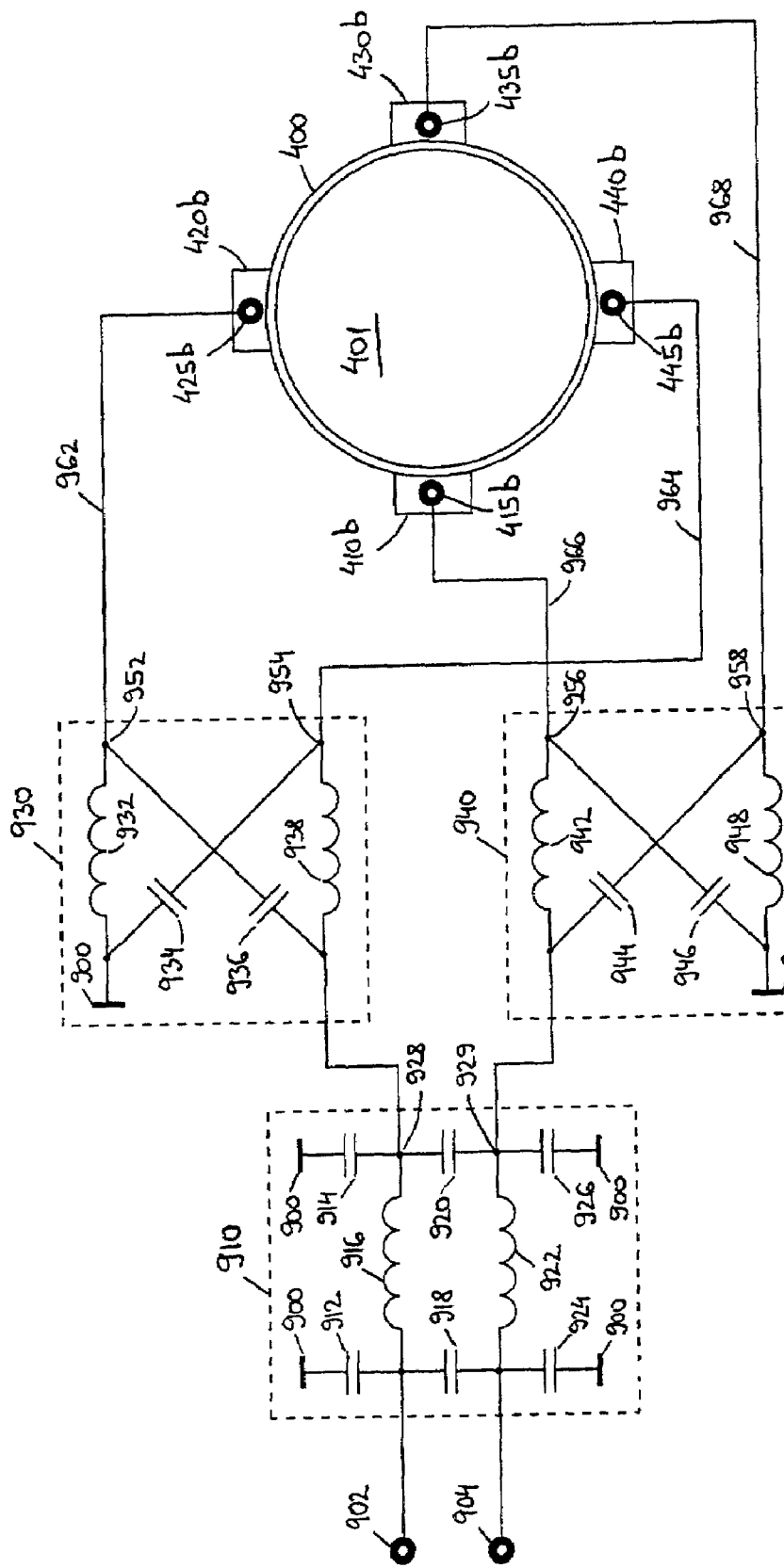
FIG. 10 is a circuit diagram of the external connections required for circularly polarized mode of operation.

FIG. 10 is a detailed electrical circuit diagram of the external circuitry which may be used to operate a four-channel coil 401, illustrated in FIGS. 5 and 6, as a transmit/receive circularly polarized single-channel coil such as may be required when a highly uniform sensitivity profile is desired. Throughout the drawing, 900 designates a RF ground. The connectors 902 and 904, represent the transmit input and the receive output, respectively, and should be connected to the MRI system which is not shown in the drawing. A quadrature hybrid combiner 910 consists of inductors 916 and 922, and capacitors 912, 914, 918, 920, 924, and 926 connected in a manner well known to those skilled in the art so that the voltages at terminals 928 and 929 have a phase difference of 90 degrees and are of equal amplitude. Terminal 928 is further connected to a balun transformer 930 consisting of inductors 932 and 938 and capacitors 934 and 936, connected in a manner well known to those skilled in the art so that the voltages at terminals 952 and 954 have a phase difference of 180 degrees and are of equal amplitude. Similarly, terminal 929 is connected to a balun transformer 940 consisting of inductors 942 and 948 and capacitors 944 and 946, connected in a manner well known to those skilled in the art so that the voltages at terminals 956 and 958 have a phase difference of 180 degrees and are of equal amplitude. Terminals 952, 954, 956, and 958 are further connected via cables 962, 964, 966, and 968 which must be of nearly equal lengths, to cable connectors 425b, 445b, 415b, and 435b, respectively. The cable connectors 415b, 425b, 435b, and 445b are located at the loop interfaces 410b, 420b, 430b, and 440b, respectively, whose detailed circuitry, suitable for transmit/receive operation, will be described in relation to FIG. 11.

By the combined action of the quadrature hybrid 910 and the balun transformers 930 and 940, the voltages at the cable connectors 415b, 425b, 435b, and 445b will be of nearly equal amplitude, but will be phase shifted in such a way so as to create a rotating magnetic field inside the coil former 400, thus mimicking the operation of a single-channel circularly polarized coil.

Figure 11:
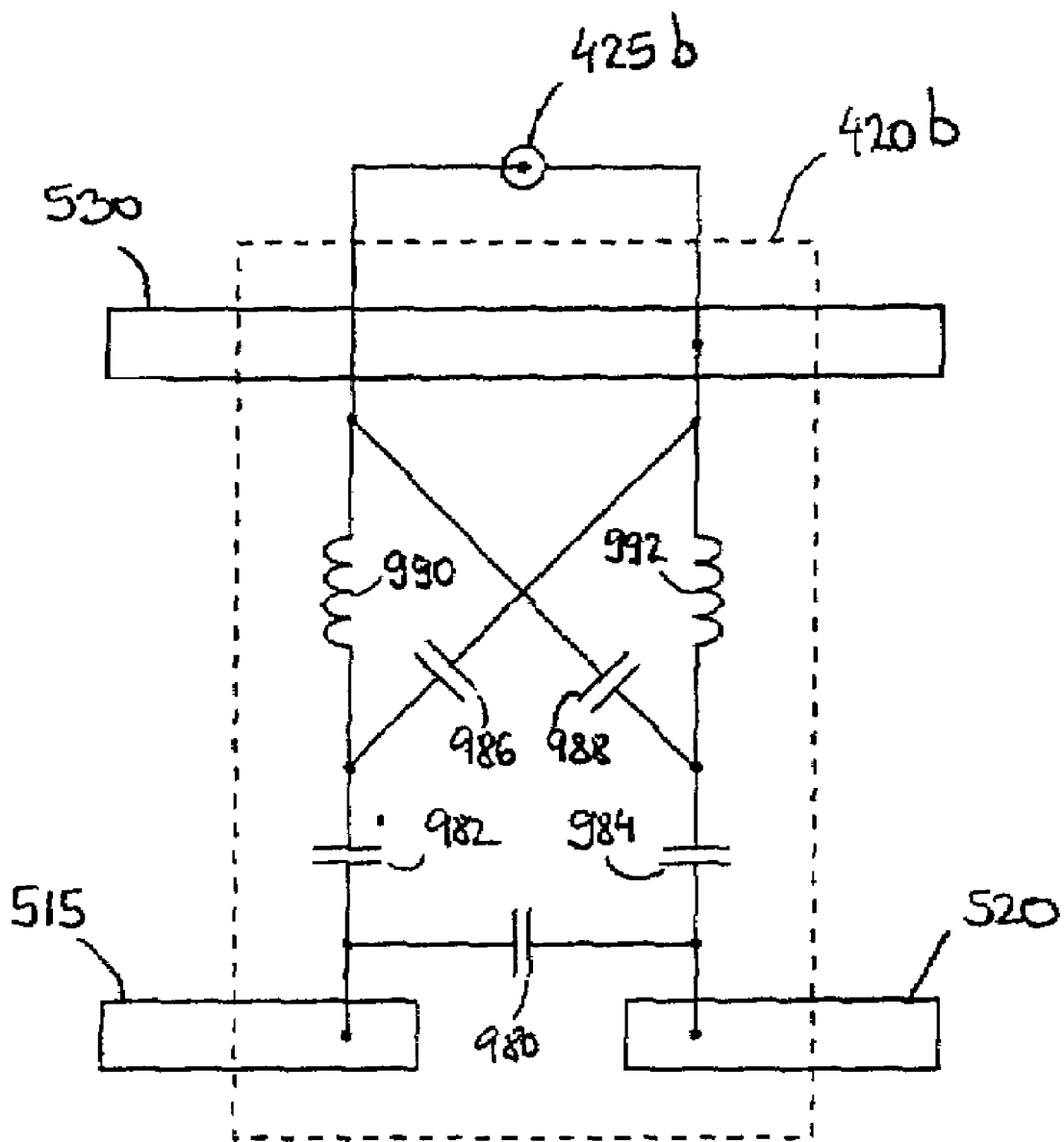
FIG. 11 is a circuit diagram of the transmit/receive loop interface.

FIG. 11 is a detailed electrical circuit diagram of one possible realization of the loop interface 420 in FIGS. 5 and 6. The particular loop interface 420b shown in FIG. 11 is suitable for transmit/receive mode of operation as in FIG. 10. The loop 501 in FIG. 5 is connected to the loop interface 420b via copper strips 515 and 520. Capacitors 980, 982, and 984 form a balanced tuning and matching network. Inductors 990 and 992 and capacitors 986 and 988 form a balun transformer whose one end is connected to the unbalanced cable connector 425b. The outer conductor of the cable connector 425b is connected to the copper strip 530, which serves as a common RF ground for all channels of the phased-array coil.

Thus, in general, the present invention provides a capacitor network with N terminal pairs connected to N loops forming a phased-array coil. The number, interconnections, and values of the capacitors forming the said capacitor network are selected and adjusted in such a way that the voltage across any two terminal pairs of a capacitor network counterbalances, as nearly as possible, the electromotive force induced in the loop connected to the same pair of terminals, the said electromotive force being due to the current flow thru all of the remaining loops.

Accordingly, while the first electromotive force is induced in a loop by the currents flowing in the remaining loops, the second electromotive force is impressed upon the same loop by the capacitor network, the said first and second electromotive forces adding up very nearly to zero. Consequently, there will be no or very little current flowing thru any of the loops forming a phased array, unless that specific loop is driven by a third, externally imposed electromotive force.

The level to which the coupling between the loops may be reduced by the present invention is primarily limited by the resistive coupling due to losses in the object being imaged by the MRI phased-array coil. Since the resistive coupling is usually small compared to the inductive coupling, the present invention makes the pre-amplifier decoupling unnecessary, thus significantly reducing the complexity of the phased-array electronic circuitry.

However, the present invention does not preclude the concurrent use of other decoupling techniques, such as pre-amplifier decoupling and coil overlap. For example, a capacitive decoupling network according to the present invention may be used in conjunction with pre-amplifier decoupling for all loops and coil overlap for adjacent loops. The coupling between the loops may thus be reduced to a lower level than possible when only a single decoupling technique is used in isolation.

Furthermore, the limitations inherent in the coil overlap and prior art capacitive decoupling schemes, which limit the decoupling to adjacent coils only, are overcome in the present invention by implementing an N terminal pair capacitive network, where N may be as large as the number of loops in the phased-array. Since each terminal pair of the decoupling capacitor network provides the decoupling voltage to one loop, it is possible to decouple any two loops within a phased-array, regardless of whether they are adjacent to each other or not.

In addition, according to the present invention, the adjacent loops can be decoupled even if they do not overlap. This is especially advantageous for applications involving new parallel imaging techniques, such as SENSE and SMASH. Namely, recent research shows that the phased-array coils consisting of non-overlapping loops provide a superior performance in SENSE applications as compared to the conventional phased-array coils made out of overlapping loops. Furthermore, the present invention provides for better isolation between any two individual phased-array channels, which in turn leads to a better localization or focusing of the sensitivity profile for each channel, in addition to an improved definition, control, and reproducibility of the sensitivity profile, factors which are very desirable for any SENSE or SMASH specific phased-array coil.

Since the present invention is based on a capacitive decoupling network, and does not require geometrically sensitive coil overlap, nor phase-shifting circuits, nor half-wavelength long cables, the phased-array coils built according to the present invention should be less sensitive to the precise positioning of the loops, should be easier to tune, and should be easier to replicate in production.

The very low coupling between the individual channels of a phased-array coil built according to the present invention, may be used to an advantage by combining the signals of individual channels thru the conventional power combining/splitting and phase-shifting circuits in order to mimic either a linearly or a circularly polarized single-channel coil. Thus, the same phased-array coil may be used as a multiple-channel coil when the application calls for a superior SNR performance, or as a single-channel circularly polarized coil whenever the application calls for a very uniform sensitivity profile.

A distinct advantage afforded by the present invention, and not possible with any of the prior art means of decoupling, is the possibility of constructing a phased-array coil whose all member loops are mutually decoupled from each other, and which phased array coil may be operated as a transmitting coil capable of withstanding substantial electrical stress associated with such a mode of operation. Furthermore, the fact that the coils are decoupled, enables all the coils to be tuned to the same frequency, which in turn, makes possible the use of the resonant effect in order to generate high intensity radio-frequency fields as is typically advantageous during transmission.

The multiple capabilities of the phased-array coil constructed according to the present invention are perhaps best illustrated by the fact that the one and the same coil may be operated as a single-channel circularly polarized transmitting coil during transmission and as either a multi-channel phased array or a single-channel circularly polarized receiving coil during reception. Additional external circuitry required for this multifunctional operation will be obvious to those skilled in the art and involves conventional switching, power combining/splitting, and phase-shifting circuits, whose exact configuration depends on the total number of channels, and the particular MRI system interface.

It is specifically intended that the present invention not be limited to the embodiments and illustrations contained herein, but that modified forms of those embodiments including portions of the embodiments and combinations of elements of different embodiments also be included as come within the scope of the following claims.

I claim:

1. A radio-frequency coil for use with magnetic resonance imaging comprising:
    at least three pairwise adjacent loops having at least two loops that are not adjacent, the loops independently supporting cyclic current flows about respective loop axes, wherein adjacent loops are non-overlapping as viewed in a direction substantially along the axes of the adjacent loops, the loops operating together to produce a phased array receiving coil in which each loop provides an independent output that may be processed separately by an associated MRI machine; and
    a capacitive network joining each of the loops providing decoupling current flows between the loops to decouple the loops from each other for phased array operation, whereby the loops are electrically decoupled from each other; wherein further the loops are displaced along one of: (i) a line to define a substantially planar surface; and (ii) a circle to define a substantially cylindrical surface.

2. The radio frequency coil of claim 1 wherein the loops are substantially rectangular.

3. The radio frequency coil of claim 1 including at least five pairwise adjacent loops and wherein the capacitor network provides a conductive path having a first impedance between at least one given loop and immediate neighbor loops adjacent to the given loop, and a second conductive path having a second impedance greater than the first impedance between the given loop and non-neighbor loops not adjacent to the given loop.

4. The radio frequency coil of claim 1 wherein the network includes a transverse conductor extending generally parallel to an axis of displacement of the loops with respect to each other;
    wherein each loop is broken by a first series capacitor at a point across from the transverse conductor, the capacitor separating a right terminal and a left terminal of the loop; and
    wherein the right terminal of each loop is connected to a left terminal of its neighbor loop, if any, and through a parallel capacitor to the transverse conductor;
    and wherein the left terminal of each loop is connected to the right terminal of its neighbor loop, if any and a parallel capacitor to the transverse conductor.

5. The radio frequency coil of claim 4 wherein each loop is further broken by second and third series capacitors between the loop and the first terminal and the loop and the second terminal respectively.

6. The radio frequency coil of claim 1 wherein each loop includes a transverse portion extending generally parallel to an axis of displacement of the loops with respect to each other, the transverse portion defining a separate right terminal and a left terminal of the loop; and
    wherein the right terminal of each loop is connected to a left terminal of its neighbor loop, if any, and through a parallel capacitor to a transverse conductor;
    wherein the left terminal of each loop is connected to the right terminal of its neighbor loop, if any and a parallel capacitor to the transverse conductor; and
    wherein the transverse conductor is broken by a capacitor.

7. The radio-frequency coil of claim 1 including at least three signal leads communicating one with each with one of the respective loops and a switchable combiner communicating with the signal leads operating to alternately provide separate outputs for each of the signal leads for phased array operation and combined outputs for combined operation.

8. A radio-frequency coil for use with magnetic resonance imaging comprising:
    at least three loops independently supporting cyclic resonant current flows about a respective axis, the at least three loops including both adjacent and non adjacent loops and wherein adjacent loops are non-overlapping as viewed in a direction substantially along the axes of the adjacent loops, the loops operating to produce a phased array coil providing independent outputs that may be processed separately by an associated MRI machine; and a capacitive network joining each of the loops operating to provide current flows both between the adjacent loops and the non-adjacent loops to decouple each of the adjacent and non-adjacent loops from voltages induced by current flows in other of the adjacent and non-adjacent loops to decouple the loops from each other for phased array operation, whereby the loops are electrically decoupled from each other; wherein further the loops are displaced along one of: (i) a line to define a substantially planar surface; and (ii) a circle to define a substantially cylindrical surface.

9. The radio frequency coil of claim 8 wherein the loops are substantially rectangular.

10. The radio frequency coil of claim 8 including at least five pairwise adjacent loops and wherein the capacitor network provides a conductive path having a first impedance between at least one given loop and immediate neighbor loops adjacent to the given loop, and a second conductive path having a second impedance greater than the first impedance between the given loop and non-neighbor loops not adjacent to the given loop.

11. The radio frequency coil of claim 8 wherein the network includes a transverse conductor extending generally parallel to an axis of displacement of the loops with respect to each other;
  wherein each loop is broken by a first series capacitor at a point across from the transverse conductor, the capacitor separating a right terminal and a left terminal of the loop; and
  wherein the right terminal of each loop is connected to a left terminal of its neighbor loop, if any, and through a parallel capacitor to the transverse conductor;
  and wherein the left terminal of each loop is connected to the right terminal of its neighbor loop, if any and a parallel capacitor to the transverse conductor.

12. The radio frequency coil of claim 11 wherein each loop is further broken by second and third series capacitors between the loop and the first terminal and the loop and the second terminal, respectively.

13. The radio frequency coil of claim 8 wherein each loop includes a transverse portion extending generally parallel to an axis of displacement of the loops with respect to each other, the transverse portion defining a separate right terminal and a left terminal of the loop; and
  wherein the right terminal of each loop is connected to a left terminal of its neighbor loop, if any, and through a parallel capacitor to a transverse conductor;
  wherein the left terminal of each loop is connected to the right terminal of its neighbor loop, if any and a parallel capacitor to the transverse conductor; and
  wherein the transverse conductor is broken by a capacitor.

14. The radio-frequency coil of claim 8 including at least three signal leads communicating one with each with one of the respective loops and a switchable combiner communicating with the signal leads operating to alternately provide separate outputs for each of the signal leads for phased array operation and combined outputs for combined operation.

15. A radio-frequency coil for use with magnetic resonance imaging comprising:
  at least three loops independently supporting cyclic resonant current flows about a respective axis, the at least three loops including both adjacent and non-adjacent loops, the loops operating together to produce a phased array receiving coil in which each loop provides an independent output that may be processed separately by an associated MRI machine; and
  a capacitive network joining each of the loops operating to provide current flows both between the adjacent loops and the non-adjacent loops to decouple each of the adjacent and non-adjacent loops from voltages induced by current flows in other of the adjacent and non-adjacent loops to decouple the loops from each other for phased array operation, whereby the loops are electrically decoupled from each other; wherein further the loops are displaced along one of: (i) a line to define a substantially planar surface; and (ii) a circle to define a substantially cylindrical surface.

16. The radio frequency coil of claim 15 wherein the loops are substantially rectangular.

17. The radio frequency coil of claim 15 including at least five pairwise adjacent loops and wherein the capacitor network provides a conductive path having a first impedance between at least one given loop and immediate neighbor loops adjacent to the given loop, and a second conductive path having a second impedance greater than the first impedance between the given loop and non-neighbor loops not adjacent to the given loop.

18. The radio frequency coil of claim 15 wherein the network includes a transverse conductor extending generally parallel to an axis of displacement of the loops with respect to each other;
  wherein each loop is broken by a first series capacitor at a point across from the transverse conductor, the capacitor separating a right terminal and a left terminal of the loop; and
  wherein the right terminal of each loop is connected to a left terminal of its neighbor loop, if any, and through a parallel capacitor to the transverse conductor;
  and wherein the left terminal of each loop is connected to the right terminal of its neighbor loop, if any and a parallel capacitor to the transverse conductor.

19. The radio frequency coil of claim 18 wherein each loop is further broken by second and third series capacitors between the loop and the first terminal and the loop and the second terminal, respectively.

20. The radio frequency coil of claim 15 wherein each loop includes a transverse portion extending generally parallel to an axis of displacement of the loops with respect to each other, the transverse portion defining a separate right terminal and a left terminal of the loop; and
  wherein the right terminal of each loop is connected to a left terminal of its neighbor loop, if any, and through a parallel capacitor to a transverse conductor;
  wherein the left terminal of each loop is connected to the right terminal of its neighbor loop, if any and a parallel capacitor to the transverse conductor; and
  wherein the transverse conductor is broken by a capacitor.

21. The radio-frequency coil of claim 19 including at least three signal leads communicating one with each with one of the respective loops and a switchable combiner communicating with the signal leads operating to alternately provide separate outputs for each of the signal leads for phased array operation and combined outputs for combined operation.

* * * * *